United States Patent

Chiu

[11] Patent Number: 5,953,209
[45] Date of Patent: Sep. 14, 1999

[54] PUSH AND PULL DUAL-FAN HEAT SINK DESIGN

[75] Inventor: Chia-Pin Chiu, Chandler, Ariz.

[73] Assignee: Intel Corporation, Santa Clara, Calif.

[21] Appl. No.: 08/990,713

[22] Filed: Dec. 15, 1997

[51] Int. Cl.[6] .................................................. H05H 7/20
[52] U.S. Cl. ................................... 361/697; 361/715
[58] Field of Search .................... 165/80.3, 121, 165/185; 361/687–688, 694–697, 715, 730, 752

[56] References Cited

U.S. PATENT DOCUMENTS

| | | | |
|---|---|---|---|
| 4,520,425 | 5/1985 | Ito | 361/697 |
| 5,502,618 | 3/1996 | Chiou | 361/695 |
| 5,526,229 | 6/1996 | Wakabayashi et al. | 361/697 |
| 5,638,895 | 6/1997 | Dodson | 361/697 |
| 5,787,971 | 8/1998 | Dodson | 361/697 |

FOREIGN PATENT DOCUMENTS 5160589   6/1993   Japan ..................................... 361/697

*Primary Examiner*—Gregory Thompson
*Attorney, Agent, or Firm*—Blakely, Sokoloff, Taylor & Zafman

[57] ABSTRACT

An electronic cartridge that includes a pair of fans which push and pull air from a heat sink of an electronic cartridge. The heat sink is mounted to the electronic cartridge. The cartridge may include integrated circuit packages which generate heat that flows into the heat sink. A first fan is attached to the heat sink and induces a flow of air into the sink. A second fan is attached to the heat sink and induces a flow of air away from the sink. The heat sink typically has a plurality of fins that are separated by a plurality of channels. The fans induce a flow of air across the channels from the first fan to the second fan. The flow of air across the channels reduces the likelihood of dead air zones within the heat sink and hot spots on the cartridge.

5 Claims, 2 Drawing Sheets

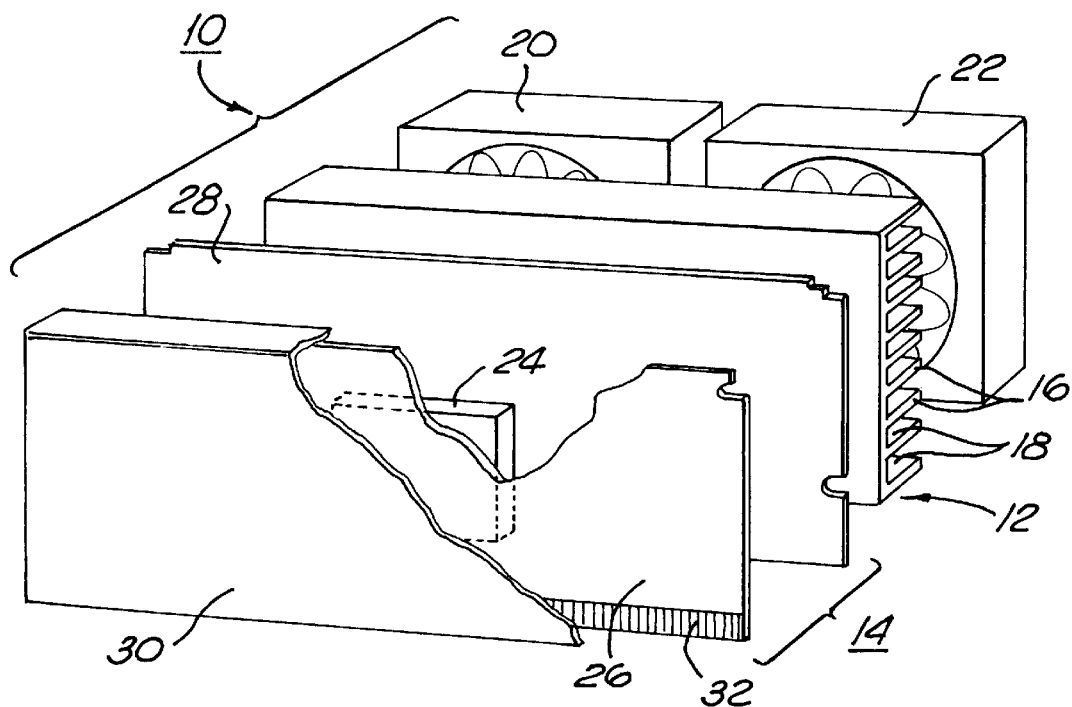
F I G. 2

PUSH AND PULL DUAL-FAN HEAT SINK DESIGN

BACKGROUND OF THE INVENTION

1. Field of the Invention

The present invention relates to a cooling system for an electronic cartridge.

2. Background Information

Integrated circuits are typically assembled into packages that are mounted to a printed circuit board. The printed circuit board may contain a connector which mates with a corresponding connector of a motherboard. The connectors electrically couple the circuit board and accompanying integrated circuits to the motherboard. The printed circuit board may also have a heat sink to facilitate the removal of heat generated by the integrated circuits.

FIG. 1 shows an electronic assembly which includes a single fan 1 that is attached to a heat sink 2. The heat sink 2 is mounted to an electronic cartridge 3. The cartridge 3 may contain a number of integrated circuit packages (not shown) that are mounted to a printed circuit board (not shown). The integrated circuit packages are also thermally coupled to the heat sink 2 so that heat generated by the circuits flows into the sink 2. The fan 1 induces an air flow which increases the heat transfer rate from the heat sink 2 to the ambient. The increase in heat transfer rate lowers the junction temperatures of the integrated circuits.

Using a single fan may create a dead air zone 4 underneath the fan hub. The dead air zone has a relatively low level of air flow that may create a "hot spot" on the cartridge. The dead air zone may be located on an area of the cartridge that generates a large amount of heat. For example, the hot spot may be located adjacent to a high powered integrated circuit such as a microprocessor. It would be desirable to provide an electronic assembly which contains a fan that does not create a dead zone of air.

SUMMARY OF THE INVENTION

An embodiment of the present invention is an electronic assembly that includes a pair of fans which push and pull air from a heat sink of an electronic cartridge. The heat sink may be mounted to the electronic cartridge. A first fan is attached to the heat sink and induces a flow of air into the sink. A second fan is attached to the heat sink and induces a flow of air away from the sink.

BRIEF DESCRIPTION OF THE DRAWINGS

FIG. 2 is an exploded view of an embodiment of an electronic cartridge of the present invention;

DETAILED DESCRIPTION OF THE INVENTION

One embodiment of the present invention is an electronic cartridge that includes a pair of fans which push and pull air from a heat sink of an electronic cartridge. The heat sink is mounted to the electronic cartridge. The cartridge may include integrated circuit packages which generate heat that flows into the heat sink. A first fan is attached to the heat sink and induces a flow of air into the sink. A second fan is attached to the heat sink and induces a flow of air away from the sink. The heat sink typically has a plurality of fins that are separated by a plurality of channels. The fans induce a flow of air across the channels from the first fan to the second fan. The flow of air across the channels reduces the likelihood of dead air zones within the heat sink and hot spots on the cartridge.

Figure 1:
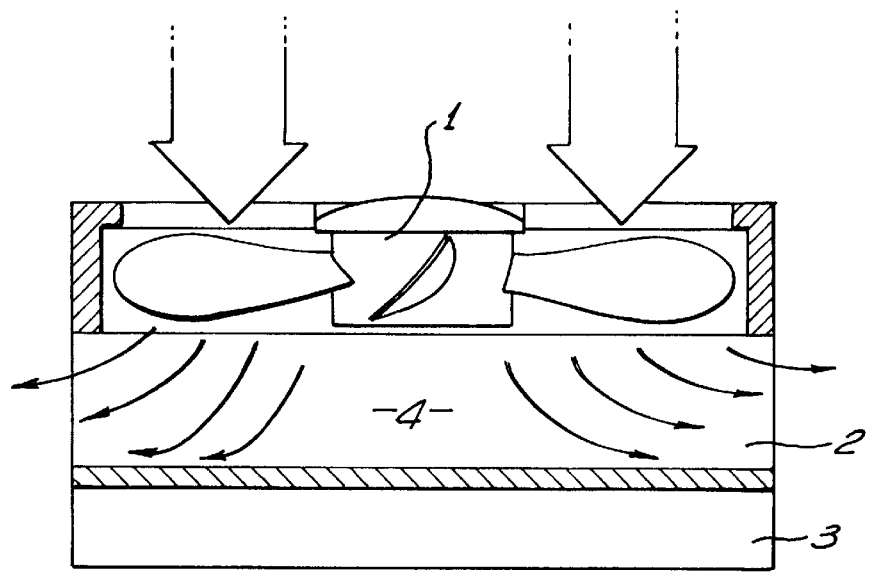
FIG. 1 is a side view of an electronic cartridge of the prior art.
Figure 3:
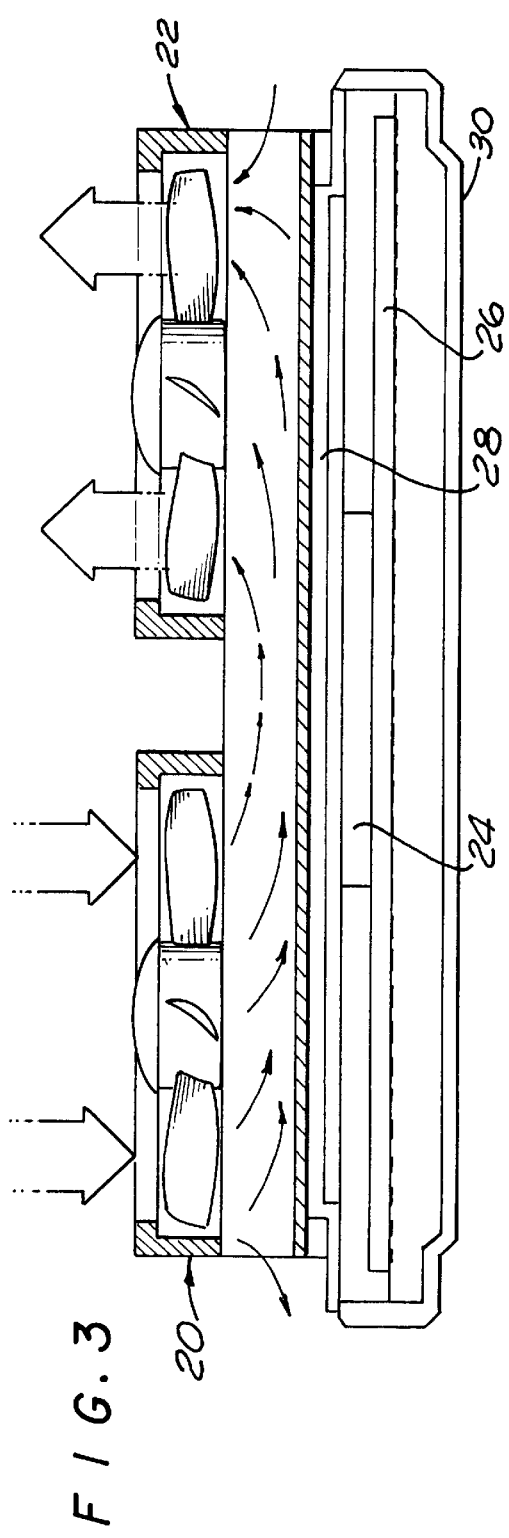
FIG. 3 is a side view of the electronic cartridge.

Referring to the drawings more particularly by reference numbers, FIGS. 2 and 3 show an electronic cartridge 10 of the present invention. The cartridge 10 may include a heat sink 12 that is mounted to an electronic cartridge 14. The heat sink 12 typically has a plurality of fins 16 that are separated by a plurality of channels 18. The heat sink 12 is typically constructed from a thermally conductive material such as aluminum.

A first fan 20 can be attached to the heat sink 12. The first fan 20 may induce a flow of air into the heat sink 12. The cartridge 10 may also have a second fan 22 that is attached to the heat sink 12. The second fan 22 may induce a flow of air away from the heat sink 12. The air flows across the channels 18 from the first fan 20 to the second fan 22 to remove heat from the heat sink 12. The push-pull fan arrangement reduces the likelihood of dead air space within the channels 18 and hot spots on the cartridge 14. The first and second fans 20 and 22 can be electrically coupled to the cartridge 14 to receive power that energizes the fans.

The cartridge 14 may include one or more integrated circuit packages 24 that are mounted to a printed circuit board 26. The packages 24 may contain integrated circuits such as microprocessors and memory devices which generate heat. A package which contains the microprocessor may be mounted to the circuit board at a location between the first 20 and second 22 fans in the center of the printed circuit board 26.

The cartridge 14 may include a thermal plate 28 that is thermally coupled to at least one of the integrated circuit packages 24. The heat sink 12 may be attached to the thermal plate 28. The cartridge 14 may further include a cover 30 that is attached to the printed circuit board 26 and the thermal plate 28. The printed circuit board 26 may have a plurality of conductive pads 32 that extend along an edge of the board 26. The conductive pads 32 may be plugged into a card edge connector (not shown) that is mounted to a motherboard (not shown).

The cartridge 14 is typically plugged into a motherboard which provides power and various signals to the integrated circuits. The integrated circuits generate heat which flows into the thermal plate 26 and the heat sink 12. The first 20 and second 22 fans create an air flow which transfers the heat from the heat sink 12 to the ambient.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

Figure 4:
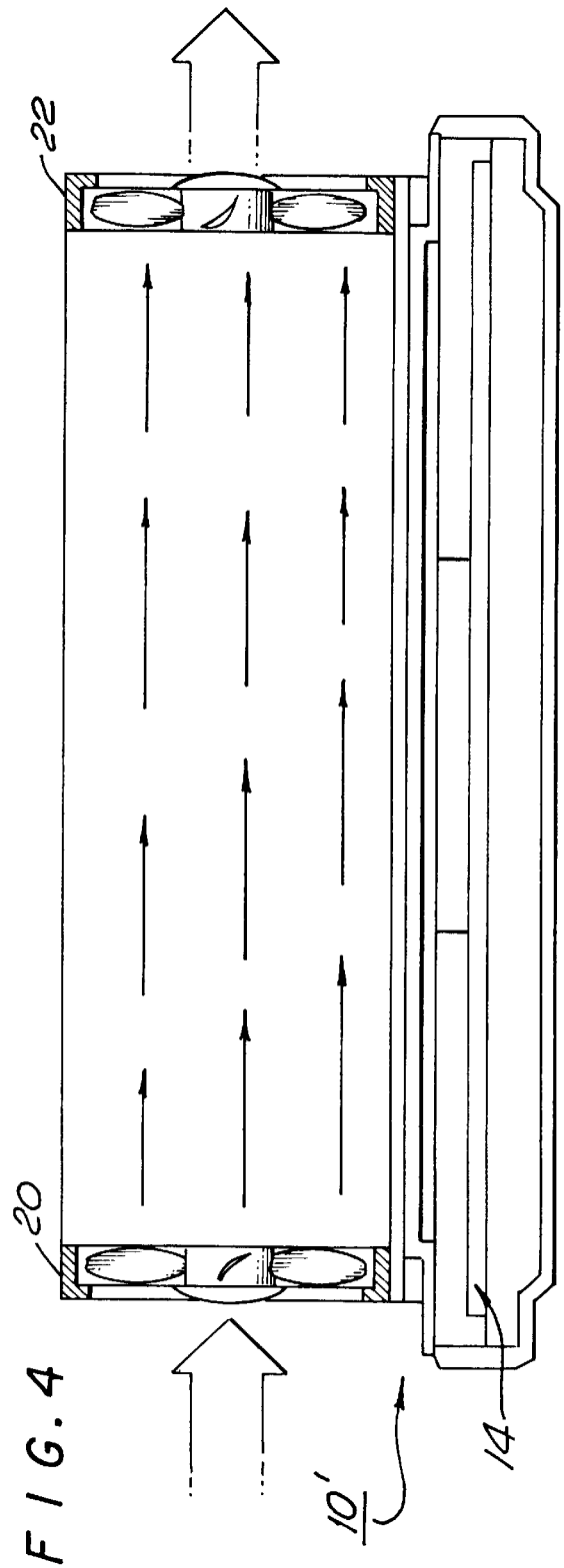
FIG. 4 is a side view of an alternate embodiment of the cartridge.

FIG. 4 shows an alternate embodiment of an cartridge 10' which has a first fan 20 and a second fan 22 that create a flow of air that is essentially parallel to the cartridge 14. The parallel air flow may have a lower pressure drop than the perpendicular air flow created by the fan arrangement shown in FIG. 3.

What is claimed is:

1. An electronic cartridge, comprising:

an electronic cartridge;

a heat sink that is mounted to said electronic cartridge and has a plurality of fins;

a first fan that is mounted to said fins of said heat sink and which induces a flow of air into said heat sink; and, a second fan that is mounted to said fins of said heat sink and which induces a flow of air away from said heat sink.

2. The cartridge as recited in claim 1, wherein said electronic cartridge includes a plurality of integrated circuit packages that are mounted to a printed circuit board.

3. The cartridge as recited in claim 2, wherein at least one of said integrated circuit packages is thermally coupled to said heat sink.

4. The cartridge as recited in claim 3, wherein said electronic cartridge includes a cover.

5. The cartridge as recited in claim 4, wherein said printed circuit board includes a plurality of conductive pads along an edge of said printed circuit board.

* * * * *